United States Patent
Ryu et al.

(10) Patent No.: US 7,564,092 B2
(45) Date of Patent: Jul. 21, 2009

(54) FLASH MEMORY DEVICE HAVING A SPLIT GATE

(75) Inventors: Eui-youl Ryu, Yongin-si (KR); Chul-soon Kwon, Seoul (KR); Jin-woo Kim, Suwon-si (KR); Yong-hee Kim, Suwon-si (KR); Dai-geun Kim, Suwon-si (KR); Joo-chan Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 388 days.

(21) Appl. No.: 11/503,126

(22) Filed: Aug. 14, 2006

(65) Prior Publication Data
US 2007/0026613 A1    Feb. 1, 2007

Related U.S. Application Data

(62) Division of application No. 11/119,801, filed on May 3, 2005, now Pat. No. 7,094,646.

(30) Foreign Application Priority Data
May 6, 2004 (KR) .................................. 04-31671

(51) Int. Cl.
*H01L 29/76* (2006.01)
*H01L 29/788* (2006.01)

(52) U.S. Cl. ...................................... 257/315; 257/314

(58) Field of Classification Search ......... 257/314–324, 257/E27.085
See application file for complete search history.

(56) References Cited

U.S. PATENT DOCUMENTS

| | | | |
|---|---|---|---|
| 5,939,749 A * | 8/1999 | Taketa et al. ................. | 257/316 |
| 6,200,859 B1 | 3/2001 | Huang et al. | |
| 6,451,654 B1 | 9/2002 | Lin et al. | |
| 6,468,863 B2 * | 10/2002 | Hsieh et al. ................. | 438/257 |
| 6,589,842 B2 | 7/2003 | Huang | |

FOREIGN PATENT DOCUMENTS

| | | |
|---|---|---|
| JP | 11-307655 | 11/1999 |
| KR | 2001-0065186 | 7/2001 |
| KR | 10-2003-0088826 | 11/2003 |

* cited by examiner

*Primary Examiner*—Cuong Q Nguyen
(74) *Attorney, Agent, or Firm*—Lee & Morse, P.C.

(57) ABSTRACT

A flash memory device having a split gate that can prevent an active region and a floating gate electrode from being misaligned, and a method of manufacturing the same, includes sequentially stacking a gate oxide layer and a floating gate conductive layer on a semiconductor substrate, forming an isolation layer in a predetermined region of the semiconductor substrate where the floating gate conductive layer is formed, and defining an active region. Then, a local oxide layer is formed by oxidizing a predetermined part of the floating gate conductive layer on the active region. A floating gate electrode structure is formed by patterning the floating gate conductive layer using the local oxide layer.

10 Claims, 6 Drawing Sheets

FIG. 8

FLASH MEMORY DEVICE HAVING A SPLIT GATE

CROSS REFERENCE TO RELATED APPLICATION

This is a divisional application based on application Ser. No. 11/119,801, filed May 3, 2005 now U.S. Pat. No. 7,094,646, the entire contents of which is hereby incorporated by reference.

BACKGROUND OF THE INVENTION

1. Field of the Invention

The present invention relates to a flash memory device. More particularly, the present invention relates to a flash memory device having a split gate and a method of manufacturing the same.

2. Description of the Related Art

Non-volatile memory devices are now widely used in various fields because of an ability to electrically store and erase data, and to retain data even without power.

A flash memory device having a split gate is a type of non-volatile memory device, and has a structure in which a floating gate and a control gate are separated. The floating gate is electrically isolated from the exterior and stores information using the characteristic that the current of a memory cell varies according to injecting (writing) electrons into the floating gate and erasing (deleting) electrons from the floating gate. The electrons are injected into the floating gate by a hot electron injection method (HEI) and are erased by a Fowler-Nordheim (F-N) tunneling method using an inter-gate insulating layer between the floating gate and the control gate.

A conventional flash memory device having a split gate with such characteristics is formed by the following method.

Figure 1A:
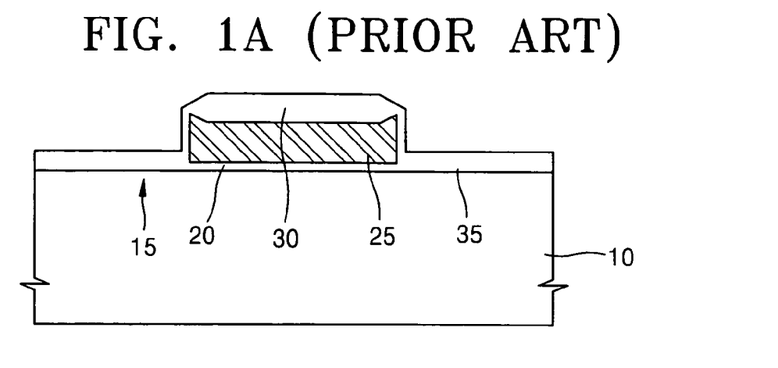
FIGS. 1A through 1C illustrate sectional views of progressive stages of a method of manufacturing a conventional flash memory device having a split gate.

Referring to FIG. 1A, an isolation layer (not shown) is formed in a predetermined part of a semiconductor substrate 10 in order to define an active region 15. A gate oxide layer 20 and a polysilicon layer (not shown) for a floating gate electrode are deposited on the semiconductor substrate 10 in which the active region 15 is formed. A silicon nitride layer pattern (not shown) is formed using photolithography to expose a prearranged floating gate electrode region. A local oxide layer 30 is formed by oxidizing the polysilicon layer for a floating gate electrode, which is exposed by a silicon nitride layer pattern. Next, the silicon nitride layer pattern is removed. The polysilicon layer for a floating gate electrode is etched using the local oxide layer 30 as a mask, thus forming a floating gate pattern 25. Then, an inter-gate oxide layer 35 is formed on the surface of the gate oxide layer 20 and the floating gate pattern 25.

Figure 1B:
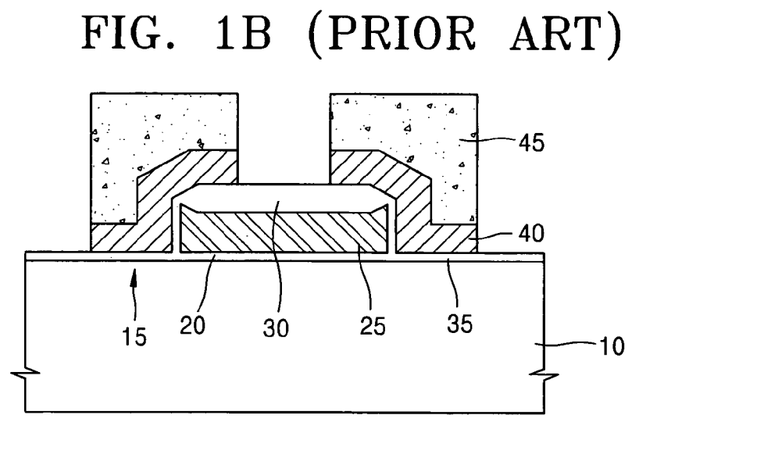

Referring to FIG. 1B, a polysilicon layer for a control gate electrode is deposited on the inter-gate oxide layer 35 and the local oxide layer 30. Next, a first mask pattern 45 is formed by standard photolithography so that the polysilicon layer for a control gate electrode can overlap with part of the upper part of the floating gate pattern 25 and both ends of the floating gate pattern 25. A control gate electrode 40 is defined by patterning the polysilicon layer for a control gate electrode using the first mask pattern 45.

Figure 1C:
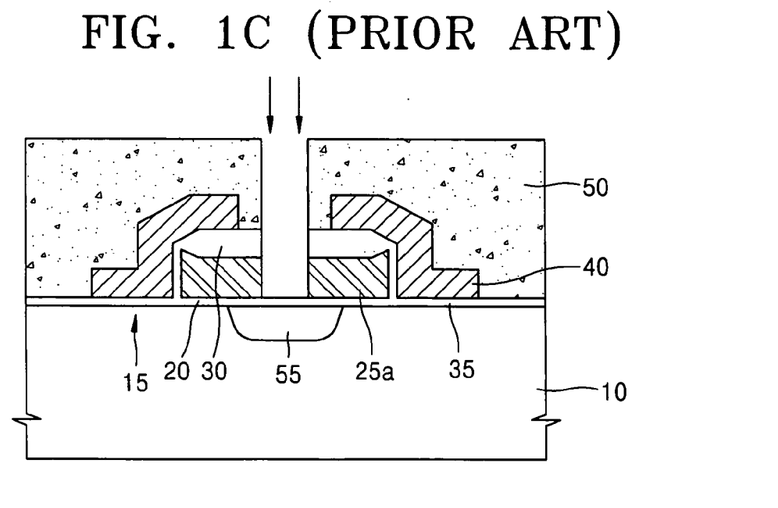

Then, referring to FIG. 1C, the first mask pattern 45 is removed and a second mask pattern 50 is formed in order to define a source region. The second mask pattern 50 is formed so that part of the local oxide layer 30 is exposed. The local oxide layer 30 and the floating gate pattern 25 are etched using the second mask pattern 50, thus opening a prearranged source region and at the same time defining a floating gate electrode 25a. Next, a source region 55 is formed by implanting impurities into the exposed active region 15. Then, the second mask pattern 50 is removed.

Thus, in the flash memory device having a split gate, an active region is defined and then a local oxide layer is defined by a silicon nitride layer pattern using photolithography, thereby defining a floating gate electrode (floating gate pattern). At this point, misalignment between the floating gate electrode (floating gate pattern) and the active region may occur because the floating gate electrode is defined by additional photolithography when the active region is formed.

As described in connection with FIG. 1C, a final floating gate electrode is also defined by the second mask pattern 50 using photolithography. However, a highly integrated semiconductor has an increased chance of misalignment and a decreased photolithography margin when a narrow region, e.g. a mask pattern exposing a source region, is formed. As a result, the configuration of the floating gate electrodes facing each other may not be symmetrical, resulting in cell current differences, thus decreasing the uniformity of elements.

Although not described in connection with the above conventional device, the split gate flash memory device includes a source line connecting source regions. Since the source line is formed on the substrate by shaping a layer of material such as polysilicon, additional processes are required and the cell size is increased.

SUMMARY OF THE INVENTION

The present invention is therefore directed to a flash memory having a split gate and a method of manufacturing the same, which substantially overcome one or more of the problems due to the limitations and disadvantages of the related art.

It is a feature of an embodiment of the present invention to provide a method of manufacturing a flash memory device having a split gate that can prevent misalignment of an active region and a floating gate electrode.

It is another feature of an embodiment of the present invention to provide a flash memory device having a split gate that can secure a photolithography margin.

It is still another feature of an embodiment of the present invention to define an active region formed after a floating gate structure.

It is yet another feature of an embodiment of the present invention to define a floating gate electrode using an insulating spacer.

It is a further feature of an embodiment of the present invention to provide a source connecting path in an isolation region.

At least one of the above and other features and advantages may be realized by providing a method of manufacturing a flash memory device having a split gate, including sequentially stacking a gate oxide layer and a floating gate conductive layer on a semiconductor substrate, forming an isolation layer in a predetermined region of the semiconductor substrate when the floating gate conductive layer is formed, thereby defining an active region, forming a local oxide layer by oxidizing a predetermined part of the floating gate conductive layer in the active region, and forming a floating gate structure by patterning the floating gate conductive layer using the local oxide layer as a mask.

The method may further include sequentially stacking an inter-gate electrode insulating layer, a control gate conductive layer and a hard mask layer on a resultant structure on the semiconductor substrate, etching predetermined parts of the hard mask layer, control gate conductive layer, inter-gate electrode insulating layer and the local oxide layer to expose a predetermined part of the floating gate structure, forming an insulating spacer on a sidewall of the hard mask layer, a sidewall of the control gate conductive layer and a sidewall of the local oxide layer, and etching the floating gate structure using the insulating spacer as a mask, thereby defining a floating gate electrode and a source region.

The method may further include forming a control gate structure including an inter-gate electrode insulating layer, a control gate conductive layer and a hard mask layer on a resultant structure of the semiconductor substrate, the control gate structure exposing a predetermined part of the floating gate structure, etching the local oxide layer using the control gate structure as a mask, forming an insulating spacer on a sidewall of the control gate structure and a sidewall of the local oxide layer, etching the exposed floating gate structure and the isolation layer using the insulating spacer as a mask, thereby defining a pair of floating gate electrodes and a trench for a path, forming a source region in the active region exposed between the pair of floating gate electrodes and a source path in a lower part of the trench for the path, forming a control gate electrode by etching a predetermined part of the control gate structure, and forming a drain region in the active region on one side of the control gate electrode. The control gate electrode and the drain region may be formed by forming a mask pattern to expose a predetermined part of the control gate structure, forming a control gate electrode by patterning the control gate structure using the mask pattern, forming a drain region by injecting impurities into the active region exposed by the control gate electrode, and removing the mask pattern.

Defining the active region may include forming a trench by etching the floating gate conductive layer, the gate oxide layer, and a predetermined depth of the semiconductor substrate, using a mask exposing the floating gate conductive layer in an isolation region, and filling the trench with an insulating layer, thereby forming the isolation layer.

The local oxide layer may be formed by exposing a predetermined part of the floating gate conductive layer in the active region through the mask, oxidizing the exposed floating gate conductive layer using the mask, and removing the mask.

At least one of the above and other features and advantages of the present invention may be realized by providing a flash memory device having a split gate, including a semiconductor substrate, a gate oxide layer on the semiconductor substrate, a pair of floating gate electrodes on the gate oxide layer, separated by a predetermined distance, a control gate electrode that overlaps a part of an upper part and a side of a corresponding floating gate electrode, an inter-gate oxide layer between the corresponding floating gate electrode and the control gate electrode, and an insulating spacer formed on a sidewall of the control gate electrode.

At least one of the above and other features and advantages of the present invention may be realized by providing flash memory device having a split gate, including a semiconductor substrate having an isolation region and an active region, a gate oxide layer on the semiconductor substrate, a pair of floating gate electrodes on the gate oxide layer, separated by a predetermined distance, a control gate electrode that overlaps a part of an upper surface and a side of a corresponding floating gate electrode, an inter-gate oxide layer between the corresponding floating gate electrode and the control gate electrode, an insulating spacer formed on a sidewall of the control gate electrode, a source region formed in the active region between the pair of floating gate electrodes, a drain region formed in the active region beyond the control gate electrode, and a source path formed in the isolation region, electrically connecting neighboring source regions.

The floating gate conductive layer and the control gate conductive layer may be formed of doped polysilicon. The insulating spacer may be formed of a material having an etch selectivity with respect to the floating gate conductive layer, e.g., silicon nitride. A side of the insulating spacer and a side of the corresponding floating gate electrode may be aligned. A source region may be formed between the pair of floating gate electrodes, and a drain region may be formed beyond the control gate electrode. The inter-gate oxide layer may include a first oxide layer formed on the corresponding floating gate electrode and a second oxide layer located on a sidewall of the corresponding floating gate electrode. The source path may be an impurity region formed in a lower part of the isolation region.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Applications No. 2004-31671, filed on May 6, 2004, in the Korean Intellectual Property Office, and entitled: "Flash Memory Device Having Split Gate and Method of Manufacturing the Same," is incorporated by reference herein in its entirety.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art. Like reference numerals denote like elements throughout the specification. In the drawings, the thickness of layers and regions may be exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

According to the present invention, an active region is defined after forming a floating gate electrode material. Also, a final floating gate electrode is defined by an insulating spacer, rather than photolithographically. Moreover, a source connecting path is formed inside an isolation region.

The present invention can prevent misalignment of the floating gate electrode, since a floating gate electrode material is formed before an active region is defined, and a floating gate electrode is defined by a self-aligning method while the active region is formed. Since the floating gate electrode is defined by an insulating spacer, it is possible to reduce the number of masks and secure a photolithography margin. Since a source connecting path of the present invention is buried inside an isolation layer, there is no need to form an additional layer, thus reducing overall cell size.

A flash memory device having a split gate and a method of manufacturing the same according to the present invention will now be described in detail.

Figure 2:
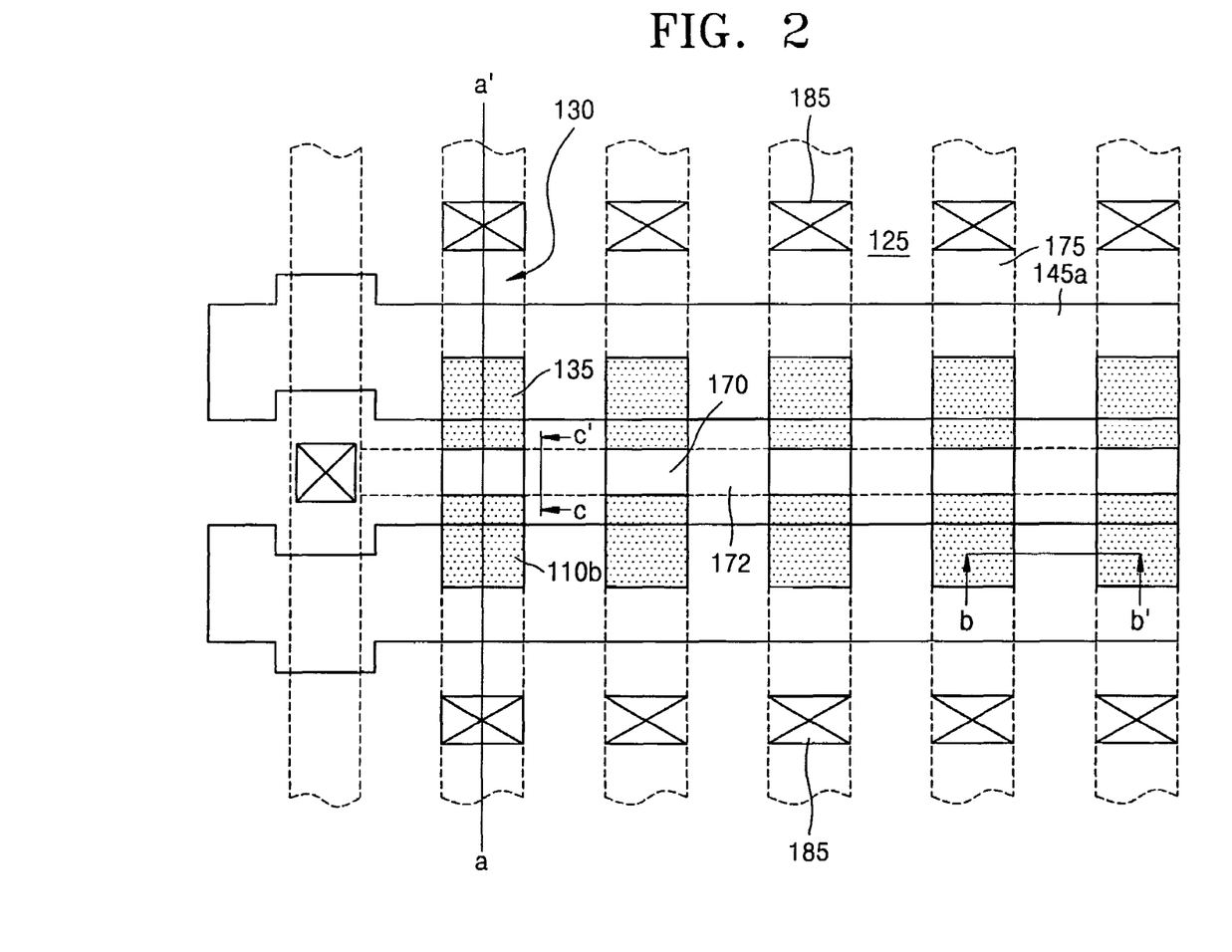
FIG. 2 illustrates a plan view of a flash memory device having a split gate according to an embodiment of the present invention.

FIG. 2 illustrates a plan view of a flash memory device having a split gate according to an embodiment of the present invention. FIGS. 3 through 8 illustrate sectional views of progressive stages of a method of manufacturing a flash memory device having a split gate according to an embodiment of the present invention. In FIGS. 3 through 8, "A", "B" and "C" refer to sections through lines a-a', b-b' and c-c', respectively, of FIG. 2.

Figure 3:
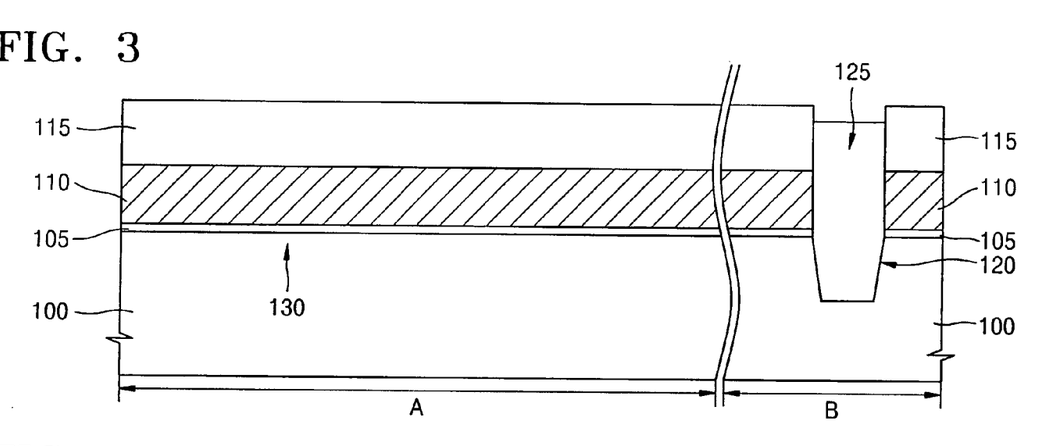
FIGS. 3 through 8 illustrate sectional views of progressive stages of a method of manufacturing a flash memory device having a split gate according to an embodiment of the present invention.

Referring to FIG. 2 and FIG. 3, a gate oxide layer 105 and a floating gate conductive layer electrode 110 (referred to as "a first conductive layer" hereinafter) are sequentially stacked on a semiconductor substrate 100 on which no isolation layer has been defined. The first conductive layer 110 may be a doped polysilicon layer, for example. A silicon nitride layer is formed on the first conductive layer 110, and a predetermined part of the silicon nitride layer is etched to define an active region having a strip shape, thus forming a silicon nitride layer pattern 115. A trench 120 is formed by etching the first conductive layer 110, the gate oxide layer 105 and a predetermined depth of the semiconductor substrate 100, using the silicon nitride layer pattern 115 as a mask. An insulating layer is deposited to fill the trench 120. An isolation layer 125 having a trench structure is formed by planarizing the insulating layer to expose the surface of the silicon nitride layer pattern 115. An active region 130 is defined by the isolation layer 125.

Figure 4:
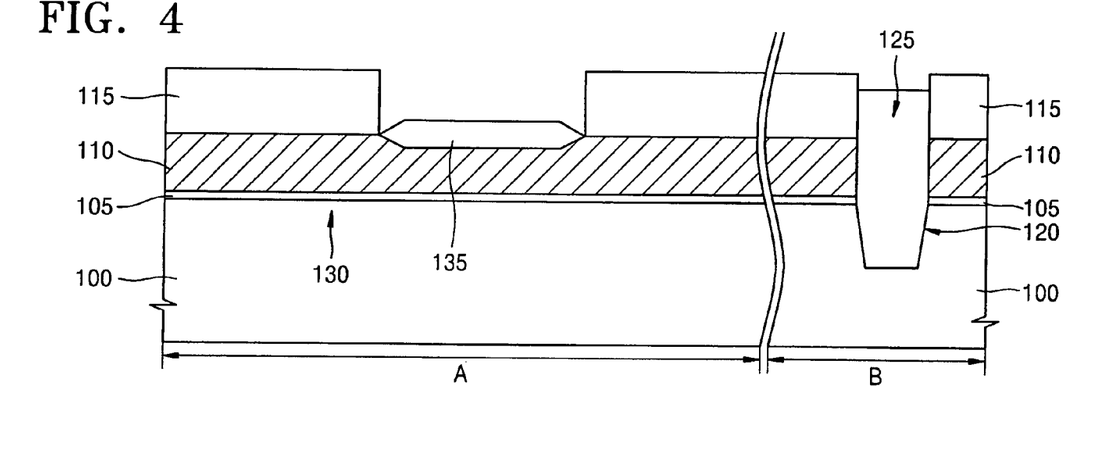

Next, referring to FIG. 2 and FIG. 4, a mask pattern (not shown) is formed by photolithography to expose a prearranged floating gate region. The silicon nitride layer pattern 115 is patterned again in accordance with the shape of the mask pattern. At this point, since photolithography is performed to expose the prearranged floating gate region while the isolation layer 125 is formed between the silicon nitride layer patterns 115, the alignment of the isolation region (or the active region) and the prearranged floating gate region is uncomplicated. Next, a local oxide layer 135 is formed by locally oxidizing the first conductive layer 110 exposed by the silicon nitride layer pattern 115.

Figure 5:
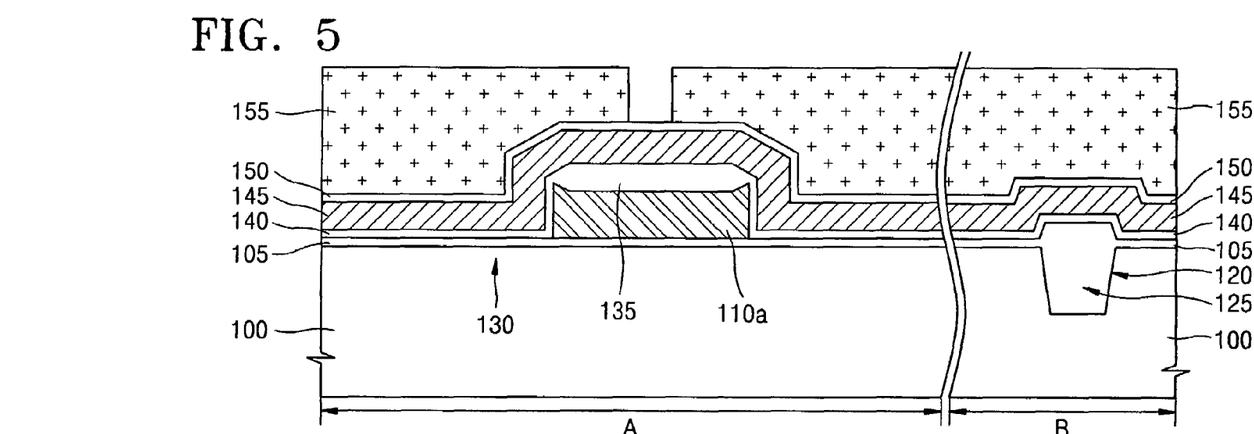

Then, referring to FIG. 2 and FIG. 5, the silicon nitride layer pattern 115 is removed by a commonly known method and the first conductive layer 110 is etched using the local oxide layer 135 as a mask, thus forming a floating gate structure 110a. One end of one side of a floating gate electrode 110b of FIG. 2 is defined by forming the floating gate structure 110a. An inter-gate oxide layer 140 is deposited on the semiconductor layer 100 on which the floating gate structure 110a is formed. A control gate conductive layer electrode 145 (referred to as "a second conductive layer" hereinafter) and a hard mask layer 150 are sequentially deposited on the inter-gate oxide layer 140 and the local oxide layer 135. The second conductive layer 145 may be a doped polysilicon layer, for example. The hard mask layer 150 may be a silicon nitride layer or a silicon oxynitride layer. Next, a mask pattern 155 for defining one end of one side of the control gate is formed by standard photolithography. At this point, the mask pattern 155 is formed to expose the central part of the floating gate structure 110a.

Figure 6:
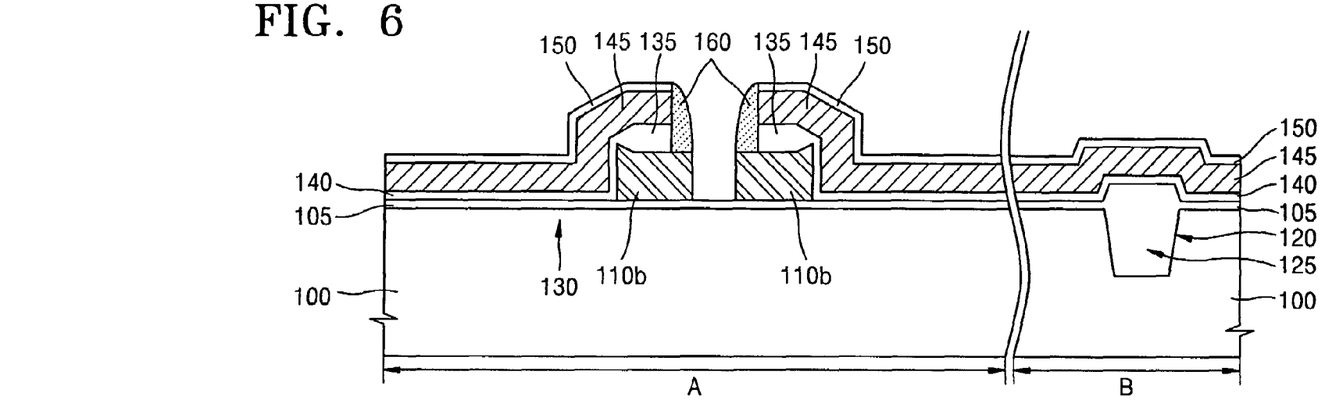

Then, referring to FIG. 2 and FIG. 6, the hard mask layer 150, the second conductive layer 145 and the local oxide layer 135 are patterned using the mask pattern 155. Next, the mask pattern 155 is removed by a commonly known method. At this point, one sidewall of the control gate electrode that will be described later is defined by the process of etching the second conductive layer 145 by the mask pattern 155. An insulating spacer 160 is formed on both sidewalls of the patterned hard mask layer 150, the second conductive layer 145, and the local oxide layer 135. The insulating spacer 160 may be formed of a layer having an etch selectivity with respect to the first conductive layer 110, e.g., a silicon nitride layer when the first conductive layer 110 is polysilicon. A final floating gate electrode 110b is defined by etching the exposed floating gate structure 110a using the insulating spacer as a mask. Misalignment and margin problems arising from photolithography are solved by using the insulating spacer 160 to define the floating gate electrode 110b, thus forming symmetrical floating gate electrodes 110b. A prearranged source region is exposed by the floating gate electrodes 110b.

Figure 7:
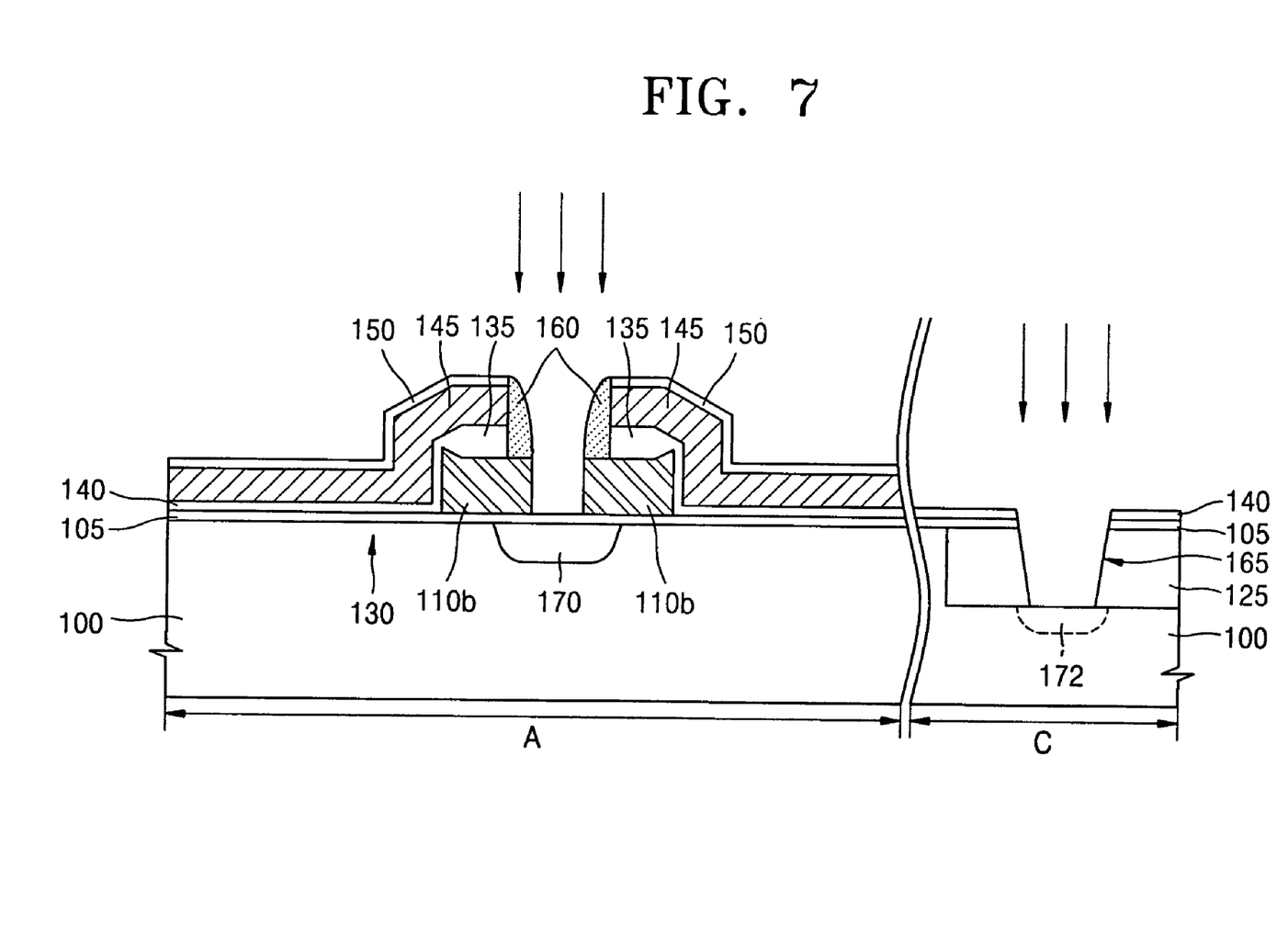

Also, referring to FIG. 2 and FIG. 7, a trench for a path 165 is formed by etching an exposed isolation layer using the insulating spacer 160 as a mask at the same time as the floating gate electrode 110b is formed. The trench for the path 165 may have the same depth as the isolation layer 20, and is formed to expose the semiconductor substrate 100. The trench for the path 165 is formed inside the isolation layer 125 with a predetermined line width, and connects the neighboring prearranged source regions. Next, a source region 170 and a source path 172 are formed by implanting impurities into the exposed prearranged source region and the lower part of the trench for the path 165. The source path 172 electrically connects the neighboring source regions 170. Therefore, the source regions 170 can be electrically connected by the source path 172 without forming an additional source line.

Figure 8:
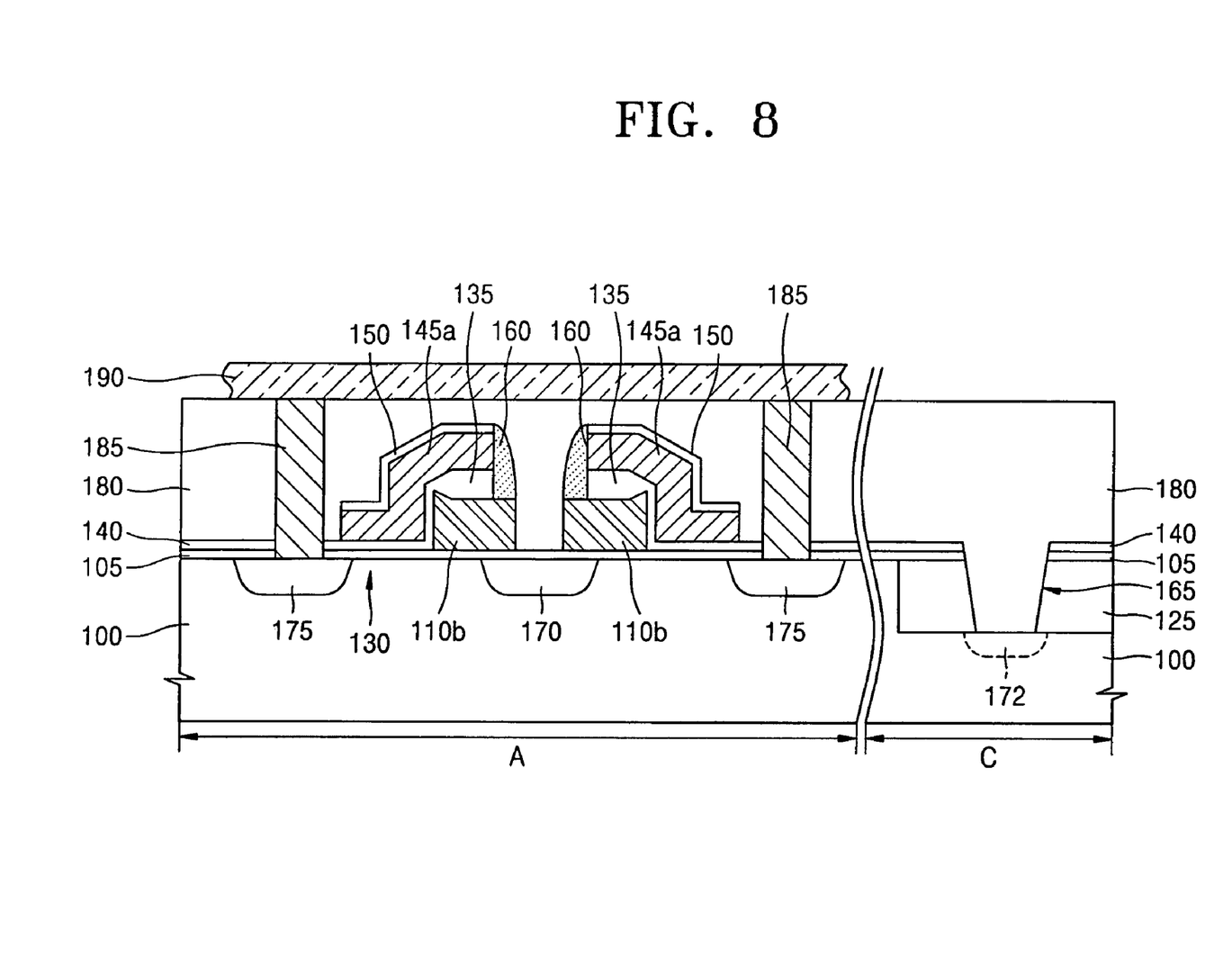

Finally, referring to FIG. 2 and FIG. 8, a mask pattern (not shown) is formed by photolithography in order to define a final control gate electrode. The residual second conductive layer 145 is etched by a mask pattern (not shown), thus forming a final control gate electrode 145a. A drain region 175 is formed by implanting impurities into the active region 130 of the exposed semiconductor substrate 100 using the control gate electrode 145a as a mask. At this point, the source region 170 and the trench for the path 165 are shielded by the mask pattern. Then, the mask pattern is removed.

An interlayer insulating layer 180 is formed on the semiconductor substrate 100 over the resultant structure, and a contact hole is formed to expose the drain region 175. A contact plug 185 is formed in the contact hole by a commonly known method. Next, a bit line 190 (not shown in FIG. 2) is formed on the interlayer insulating layer 180 to contact the contact plug 185.

As described above, according to the present invention, an active region is defined when a floating gate conductive layer electrode is formed and floating gate electrodes (a floating gate pattern) are defined by a self-aligning method. As a result, misalignment of the floating gate electrodes and the active region can be reduced.

Also, the cell current difference between transistors can be reduced because the sizes of floating gate electrodes can be made uniform by splitting one floating gate structure with a spacer.

There is no need to form a source line electrically connecting source regions on a substrate, since a source path connecting source regions is formed in an isolation region between source regions. As a result, manufacturing processes are simplified and cell size is reduced.

Since a source region according to the present invention is defined by a spacer without requiring a mask pattern, the number of mask patterns can be less than in the conventional art. In addition, since only one sidewall of the control gate electrode is defined by a mask pattern, and a source region is defined by an insulating spacer, there is no need to form a mask pattern for exposing fine spacing, and a mask pattern defining one sidewall of the control gate electrode can secure a photolithography margin.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flash memory device having a split gate, the device comprising:
    a semiconductor substrate having an isolation region and an active region;
    a gate oxide layer on the semiconductor substrate;
    a pair of floating gate electrodes on the gate oxide layer, separated by a predetermined distance;
    a control gate electrode that overlaps a part of an upper surface and a side of a corresponding floating gate electrode;
    an inter-gate oxide layer between the corresponding floating gate electrode and the control gate electrode;
    an insulating spacer formed on a sidewall of the control gate electrode;
    a source region formed in the active region between the pair of floating gate electrodes;
    a drain region formed in the active region beyond the control gate electrode; and
    a source path formed in the isolation region, electrically connecting neighboring source regions.

2. The device as claimed in claim 1, wherein a side of the insulating spacer and a side of the corresponding floating gate electrode are aligned with each other.

3. The device as claimed in claim 1, wherein the insulating spacer is silicon nitride.

4. The device as claimed in claim 1, wherein the inter-gate oxide layer comprises a first oxide layer formed on the corresponding floating gate electrode and a second oxide layer located on a sidewall of the corresponding floating gate electrode.

5. The device as claimed in claim 1, wherein the source path is an impurity region formed in a lower part of the isolation region.

6. A flash memory device as claimed in claim 1, wherein the isolation region fills a trench.

7. A flash memory device as claimed in claim 6, wherein the source path is below the trench.

8. A flash memory device as claimed in claim 7, wherein the source path is an impurity region.

9. A flash memory device as claimed in claim 8, wherein the source region and the source path have the same impurities implanted therein.

10. A flash memory device as claimed in claim 1, wherein the source region and the source path have the same impurities implanted therein.

* * * * *